United States Patent [19]

Kinzler

[11] 4,455,538

[45] Jun. 19, 1984

[54] SUBASSEMBLY, IN PARTICULAR A CHOKE AND A FILTER FOR RADIO INTERFERENCE CONTROL

[75] Inventor: Hans Kinzler, Regensburg, Fed. Rep. of Germany

[73] Assignee: Siemens Aktiengesellschaft, Berlin and Munich, Fed. Rep. of Germany

[21] Appl. No.: 402,848

[22] Filed: Jul. 29, 1982

[30] Foreign Application Priority Data

Aug. 26, 1981 [DE] Fed. Rep. of Germany ....... 3133644

[51] Int. Cl.³ .......................... H03H 1/00; H03H 7/01
[52] U.S. Cl. ............................... 333/167; 174/52 PE; 333/185; 361/419
[58] Field of Search ................................. 333/167–172, 333/181–185; 174/52 PE; 361/331–332, 380, 395, 417–419

[56] References Cited

U.S. PATENT DOCUMENTS 3,748,538 7/1973 Shekerjian et al. ........ 174/52 PE X
4,329,665 5/1982 Kawai et al. .................. 333/185 X Primary Examiner—Marvin L. Nussbaum
Attorney, Agent, or Firm—Herbert L. Lerner; Laurence A. Greenberg

[57] ABSTRACT

Subassembly for electrical components with connecting leads, including a cup-shaped metal housing, a metallic cover closing the metal housing and having a perforation formed therein, an insulating material cup being disposed in the metal housing and having an outer cup bottom being turned toward the cover, a chimney-like projection formed inside the bottom of the insulating material cup in alignment with the perforation in the cover, the projection forming a tunnel-like feed through for connecting leads of components extending out of the subassembly, and an electrical circuit plate for carrying components, the plate being pushed onto the projection at perforations formed in the plate.

6 Claims, 4 Drawing Figures

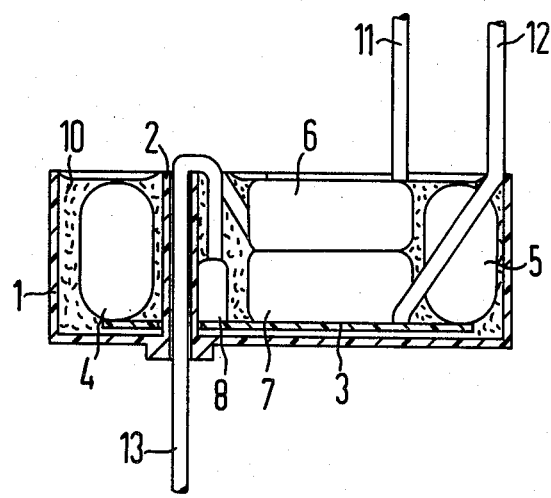
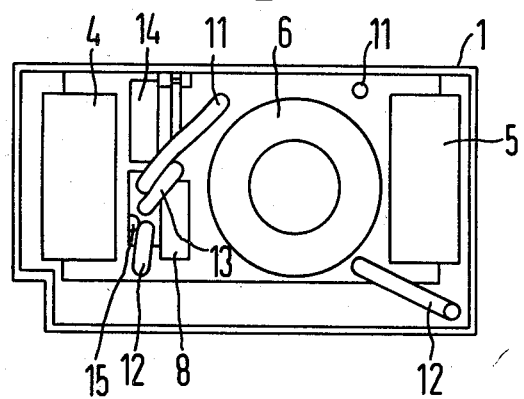

SUBASSEMBLY, IN PARTICULAR A CHOKE AND A FILTER FOR RADIO INTERFERENCE CONTROL

The invention relates to a subassembly, in particular a choke and a filter for radio interference control, with a cup-shaped metal housing, closed by a metallic housing cover, one or more electric components such as capacitors and inductors being compactly disposed in the housing and embedded in potting compound, and connection lines leading to the outside, such as protection or ground and connection conductors.

According to conventional practice, the electrical components, such as for suppression filters, are pre-assembled to form a subassembly outside the metal housing, and they are then connected in the housing to the respective connection leads. Feeding the conductors through the housing cover was avoided in suppression filters, at least if the potting material reached the underside of the cover, in order not to make the assembly of the lines in the housing more difficult. If elements such as switches, fuses and the like which were not sealed tightly due to their construction had to be fastened to the inside of the housing wall, liquid-tight embedding chambers for the electrical components were welded into the interior of the housing. Otherwise, when greater quantities were made, insulated housings had to be inserted, and the connection lines were routed over the housing edge and through a perforation through the housing wall, respectively. However, feeding the connection lines through the housing walls is difficult, because the assembly operation must be carried out in a cramped space, and the perforations of the housing must be sealed with respect to fluids, since otherwise the embedding material will run out.

It is accordingly an object of the invention to provide a subassembly, in particular a choke and a filter for radio interference control, which overcomes the hereinafore-mentioned disadvantages of the heretofore-known devices of this general type, and in particular a construction for the housing, which allows the assembly of the subassembly and its insertion into the housing to be as simple and economical as possible.

With the foregoing and other objects in view there is provided, in accordance with the invention, a subassembly for electrical components with connecting leads, especially for a choke and filter for a radio interference control compactly arranged therein in a potting compound, comprising a cup-shaped metal housing, a metallic cover closing the metal housing, and having a perforation or break-through formed therein, an insulating material cup being disposed in the metal housing and having an outer cup bottom being turned toward the cover, a chimney-like projection formed inside the bottom of the insulating material cup in alignment with the perforation in the cover, the projection forming a hollow tunnel-like feed through for connecting leads such as protection and connection conductors of components extending out of the subassembly, and an electrical circuit plate for carrying components, the plate being pushed onto the projection at perforations formed in the plate.

With this construction, it is possible to first assemble all of the electrical components and connections on the circuit board, and to produce the required electrical contacts by flow soldering, without these work operations becoming difficult because of the restricted room within the housing. Thereafter, the assembled circuit board can be easily pushed onto the chimney-like projection of the cup for the insulating material, and the remaining free spaces can be filled with the potting material. The connection leads which are guided without any space restriction through the tunnel of the chimney-like projection, do not obstruct the potting operation. By using the conventional potting procedure with epoxy resin, the connection leads are even reinforced and stiffened so that they can no longer be moved by pull or pressure loads, in spite of a desirable play of 0.2 to 0.3 mm within the tunnel of the projection.

In accordance with another feature of the invention, the projection has a height being at least as great as the depth of the insulating material cup.

In accordance with a further feature of the invention, the cup has empty spaces therein, and including potting compound exclusively filling the empty spaces. If the projection extends above the surface of the embedding compound, for example by 1 to 2 mm, potting compound cannot travel to the outside during the potting operation.

In the final assembly, the filled insulating material cup is inserted into the metal housing so that the connection leads are guided through the perforation in the metallic housing cover, and the housing cover is joined to the respective parts of the housing wall by spot welding. The housing for the insulating material can be additionally connected with the adjacent parts of the housing and the housing cover, such as by cementing.

In accordance with an added feature of the invention, the metal housing has a greater volume than the insulating material cup, and including additional non-embedded components disposed in the metal housing.

In accordance with an additional feature of the invention, the additional components include a fuse and a switch, which are in contact with the corresponding connection lead endings.

In accordance with a concomitant feature of the invention, there are provided asymmetrical capacitors disposed in the insulating material cup defining a center of mass of the capacitors, the projection being disposed in vicinity of the center of mass of the capacitors, one of the connecting leads being a ground or protective wire routed to the center of mass of the capacitors over the shorted path.

Other features which are considered as characteristic for the invention are set forth in the appended claims.

Although the invention is illustrated and described herein as embodied in a subassembly, in particular a choke and a filter for radio interference control, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 1 is a fragmentary, diagrammatic, partially cross-sectional side view of a structural component according to the invention;

FIG. 2 is a top-plan view of FIG. 1;

Figure 3:
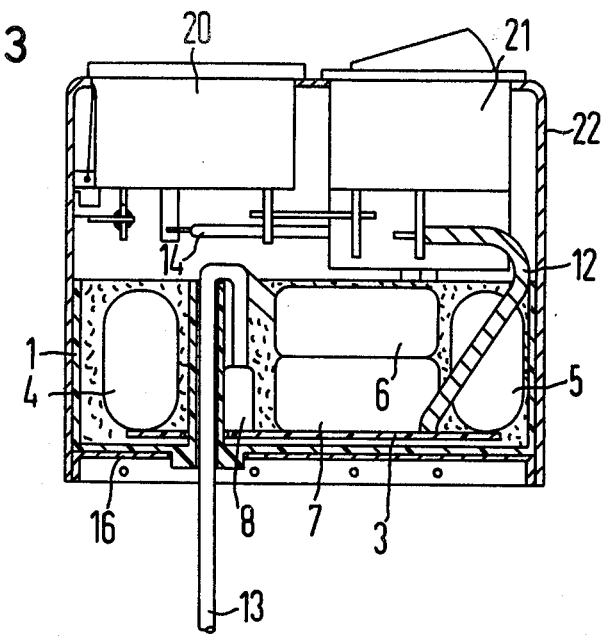
FIG. 3 is a view similar to FIG. 1 of the finished assembled component.
Figure 4:
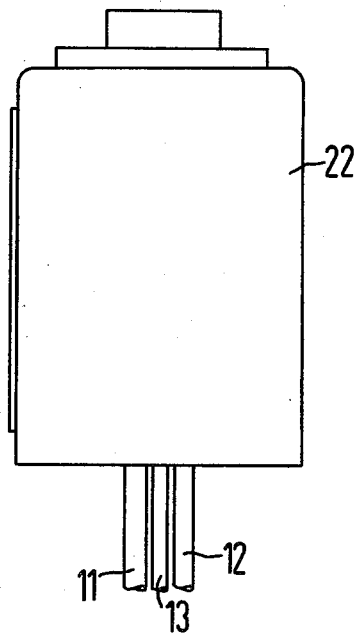
FIG. 4 is a side-elevational view of the component according to FIG. 3.

Referring now to the figures of the drawing and first particularly to FIG. 1 thereof, there is seen a cup-shaped insulation-housing 1 with a chimney-like and tunnel-forming perforating projection 2. It can be seen in FIG. 1 that the projection 2 extends upward like a tube from the bottom of the housing 1. A circuit board 3 including finished assembled electrical components, such as capacitors 4, 5, 8 and 14 (seen in FIG. 2) and chokes 6 and 7, fits onto the projection 2. The electrical connection wires, i.e. ground and connecting lines 13, and 11 and 12, respectively, are guided with some play in a tunnel 15 formed by the projection 2, and are embedded in a potting compound, especially epoxy resin, together with the electrical components in the insulation material housing. In the embodiment shown, the projection extends a few millimeters above the surface of the potting material 10.

In an apparatus with asymmetrical electrical capacitors 8, 14, as could possibly be the case with static suppression filters, the chimney-like projection 2 is in practice disposed in vicinity of the center of mass of these capacitors, so that the ground lead or protective conductor 13 is routed by the shortest path to the center of mass. This provides an optimal effect with respect to the suppression of static disturbances.

In the final assembly shown in FIG. 3, the component part according to FIGS. 1 and 2 is inserted into a cup-shaped metal housing 22 which contains additional components, such as receptacle with fuses 20 and a switch 21, that are in contact with the endings of the connecting leads 11, 12, respectively. The projection 2 extends with the connecting leads 11, 12, 13 through a perforation in a metallic housing cover 16, by means of a boss which is formed in one piece with the projection 2. The housing cover 16 is connected with the metal housing 22 by spot welding.

The disclosed compact construction makes it possible to manufacture the metal housings and housing covers with a small bottom area and a small diameter. Consequently, the drawn metal housings, which are especially aluminum housings, can be produced with lower cost at equal production volume. Due to the smaller dimensions, the manufacturing cost of the housing cover is also reduced. Additionally, fewer welding spots are required for welding the housing cover to the metal housing.

The foregoing is a description corresponding to German Application No. P 31 33 644.2, dated Aug. 26, 1981, the International priority of which is claimed for the instant application, and which is hereby made part of this application. Any discrepancies between the foregoing specification and the aforementioned corresponding German application are to be resolved in favor of the latter.

I claim:

1. Subassembly for electrical components with connecting leads, comprising a cup-shaped metal housing, a metallic cover closing said metal housing and having a perforation formed therein, an insulating material cup being disposed in said metal housing and having an outer cup bottom being turned toward said cover, a chimney-like projection formed inside the bottom of said insulating material cup in alignment with said perforation in said cover, said projection forming a tunnel-like feed through for connecting leads of components extending out of the subassembly, and an electrical circuit plate for carrying components, said plate being pushed onto said projection at perforations formed in said plate.

2. Subassembly according to claim 1, wherein said projection has a height being at least as great as the depth of said insulating material cup.

3. Subassembly according to claim 1, wherein said cup has empty spaces therein, and including potting compound exclusively filling said empty spaces.

4. Subassembly according to claim 3, wherein said metal housing has a greater volume than said insulating material cup, and including additional components disposed in said metal housing.

5. Subassembly according to claim 4, wherein said additional components include a fuse and a switch.

6. Subassembly according to claim 1, including asymmetrical capacitors disposed in said insulating material cup defining a center of mass of said capacitors, said projection being disposed in vicinity of the center of mass of said capacitors, one of the connecting leads being a ground wire routed to the center of mass of said capacitors over the shortest path.

* * * * *